US005185549A

United States Patent [19]

Sullivan

[11] Patent Number: 5,185,549

[45] Date of Patent: Feb. 9, 1993

[54] DIPOLE HORN PIEZOELECTRIC ELECTRO-ACOUSTIC TRANSDUCER DESIGN

[75] Inventor: Steven L. Sullivan, P.O. Box 705, Harpers Ferry, W. Va. 26425

[73] Assignee: Steven L. Sullivan, Harpers Ferry, W. Va.

[21] Appl. No.: 287,345

[22] Filed: Dec. 21, 1988

[51] Int. Cl.[5] .................... H01L 41/08

[52] U.S. Cl. .................... 310/334; 310/800; 381/190

[58] Field of Search .................... 310/800, 334, 335; 381/190

[56] References Cited

U.S. PATENT DOCUMENTS

| | | | |
|---|---|---|---|
| 3,792,204 | 2/1974 | Murayama et al. | 310/800 |
| 3,832,580 | 8/1974 | Yamamuro et al. | 310/800 X |
| 3,947,644 | 3/1976 | Uchikawa | 310/800 X |
| 3,973,150 | 8/1976 | Tamura et al. | 310/800 |
| 4,028,566 | 6/1977 | Franssen et al. | 310/800 |
| 4,127,749 | 11/1978 | Atoji et al. | 310/800 |
| 4,166,229 | 8/1979 | De Reggi et al. | 310/800 X |
| 4,186,323 | 1/1980 | Cragg et al. | 310/800 |
| 4,322,877 | 4/1982 | Taylor | 310/800 X |
| 4,401,911 | 8/1983 | Ravinet et al. | 310/800 |
| 4,469,920 | 9/1984 | Murphy | 310/800 X |
| 4,486,869 | 12/1984 | Carter | 310/800 X |
| 4,501,319 | 2/1985 | Edelman et al. | 310/800 X |
| 4,588,998 | 5/1986 | Yamamuro et al. | 310/800 X |

OTHER PUBLICATIONS

Masahiko Tamura et al.; Electroacoustic Transducers with Piezoelectric High Polymer Films; Sep. 10, 1974; pp. 21–26.

S. Edelman et al.; Forum Sep., 1976; vol. 24, No. 7 pp. 577–578.

Jesse Klapholz; High Polymer Piezo Film in Electro-acoustical Transducer Applications; Presented at 79th Convention; Oct. 12–16, 1985; pp. 1–19.

*Primary Examiner*—Mark O. Budd
*Attorney, Agent, or Firm*—Kevin J. Dunleavy

[57] ABSTRACT

A piezoelectric electro-acoustic device for converting an electric signal into an acoustic vibration and/or for converting acoustic vibrations into an electric signal is disclosed. The device employs at least two opposing concave membranes having a single axis of elongation tangent to the curvature thereof. The membranes face each other and are connected to electrodes. Upon changes in electric current provided to the membranes, the membranes will vibrate towards one another to thereby displace air located between the surfaces thereof. This dipole horn structure provides a high conversion efficiency as well as a true 360° acoustic response.

9 Claims, 2 Drawing Sheets

DIPOLE HORN PIEZOELECTRIC ELECTRO-ACOUSTIC TRANSDUCER DESIGN

BACKGROUND OF THE INVENTION

The present invention relates to electro-acoustic transducers comprising at least two piezoelectric polymer diaphragms. More particularly, the present invention relates to an electro-acoustic transducer device which is capable of producing a dipole horn effect.

Piezoelectric films of polyvinylidene flouride resins have been used as electro-acoustic transducers for several years. For example, in U.S. Pat. No. 3,792,204 issued on Feb. 12, 1974, there is disclosed an electro-acoustic transducer having excellent acoustic characteristics which is composed of a piezoelectric film of polyvinylidene flouride resin having an electro-conductive material on the opposite surfaces of the film.

Later research has been directed to obtaining the optimum configuration for electro-acoustic transducers which employ piezoelectric films. One of the first physical configurations developed is disclosed in U.S. Pat. No. 3,947,644 issued on Mar. 30, 1976. In this patent a piezoelectric-type electro-acoustic transducer composed of two convex or concave piezoelectric polymer films is disclosed. Each film has electrodes on both surfaces thereof and the two polymer films are so connected to electric wiring that, when one of the piezoelectric polymer films elongates by the action of an electric field in one direction, the other film shrinks by the action of the same electric field.

Another design for a piezoelectric electro-acoustic transducer is disclosed in U.S. Pat. No. 3,973,150 issued on Aug. 3, 1976. This device employs a uniaxially-stretched film of a shape having the major axis and the minor axis such that the expansion-contraction direction of the film is at a maximum parallel with the minor axis. In this configuration, the transducer can provide a high converting efficiency, especially in the low frequency output range.

A further configuration for piezoelectric transducers is disclosed in U.S. Pat. No. 4,401,911, issued on Aug. 30, 1983. This transducer includes a radiating structure whose active element is formed by a polymer film placed between two electrodes. The transducer includes a closure element having the exact shape of a spherical surface portion and being connected to at least one active peripheral suspension which simulates the movements of a pulsating sphere portion completing the closure element.

In addition, there are several other transducer designs disclosed in U.S. Pat. Nos. 4,186,323 (multi-layer transducers), 4,028,566 (undulated diaphragm) and 4,127,749 (a pair of semi-cylindrical membranes having a single axis of elongation tangent to the curvature).

From the foregoing discussion, it is apparent that several designs for piezoelectric electro-acoustic transducers presently exist. However, none of these designs has been able to achieve a dipole horn effect which provides an acoustical coupling that increases the efficiency of the transducer, or, can provide for a true 360° response. Further, none of the foregoing designs provides a 360° sound dispersion in the vertical plane as well as the horizontal plane.

Thus, there is a need in the art for a piezoelectric electro-acoustic transducer which is capable of producing a 360° response in both the vertical and horizontal planes. Moreover, there is a need in the art for a speaker system which can be centrally located in a room and which will radiate a high efficiency response in all directions to thereby provide accurate sound reproduction to the entire room.

SUMMARY OF THE INVENTION

The present invention relates to a piezoelectric-type electro-acoustic transducer. The transducer includes at least two piezoelectric films, each having electrodes on both surfaces thereof. The films are so disposed that the outer surfaces of the films face each other and are stretched into opposing concave surfaces by means of a resilient backing material located adjacent the inner surfaces of the films. The films are also connected to an electric circuit such that elongation of each of the films, as a result of the action of electric fields, causes the outer surfaces of the films to oscillate in phase and thereby displace air located between the outer surfaces of the films.

It is the primary object of the present invention to provide a dipole horn formed from a piezoelectric electro-acoustic transducer which is capable of generating a 360° response in the horizontal plane.

It is a further object of the present invention to provide a transducer system which is capable of producing a 360° response in both the vertical plane and the horizontal plane.

It is a still further object of the present invention to provide a highly efficient electro-acoustic transducer which is capable of excellent sound reproduction with low power requirements.

It is a still further object of the present invention to provide a speaker system having a large effective mouth area which is capable of displacing a large amount of air to produce excellent low-frequency sound reproduction.

It is a still further object of the present invention to provide a transducer system having a small throat area which allows for high efficiency, high-frequency sound reproduction.

These and other objects of the present invention will be apparent to one of ordinary skill in the art from the detailed description which follows.

DETAILED DESCRIPTION OF THE PREFERRED EMBODIMENTS

Figure 1:
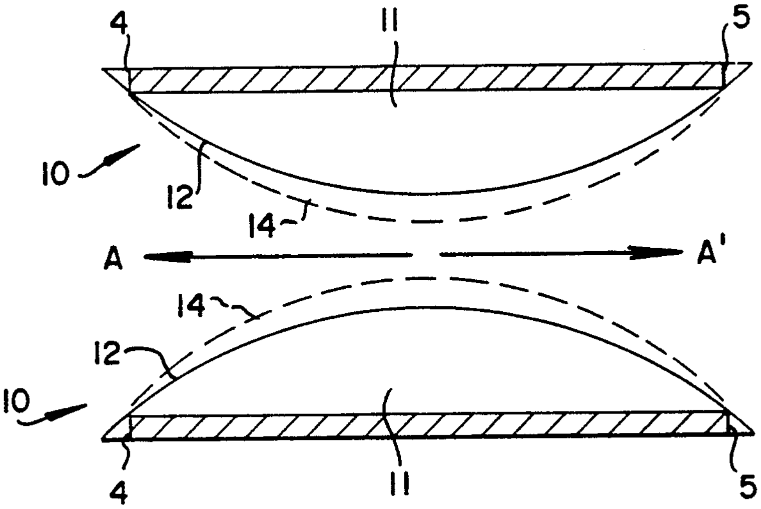
FIG. 1 is a cross-sectional view of a pair of transducers configured in accordance with the present invention.

Referring now to FIG. 1, there is shown a cross-sectional view of a pair of piezoelectric electro-acoustic transducers in accordance with the present invention. Each transducer 10 includes a resilient backing 11, a firm support member 20 attached to said backing means 11 as shown, and a piezoelectric film 12 mounted on resilient backing 11. Each piezoelectric film 12 has attached to its outer surface a first electrode 5 and to its inner surface a second electrode 4. Piezoelectric film 12 is attached to resilient backing member 11 along the edges thereof by a suitable attachment means such as an adhesive.

Also depicted in FIG. 1 is the movement of piezoelectric film 12 upon application of an electrical signal via electrodes 4,5. The two piezoelectric films 12 are mounted such that they will expand towards one another simultaneously and contract away from one another simultaneously in response to changes in the electrical signal. The films 12 expand to positions 14 shown by the dotted line of FIG. 1. Thus, expansion and contraction of piezoelectric film 12 will displace air located between the two transducers 10 and create force vectors a and al in the direction of the arrows in FIG. 1. These force vectors will be created through 360° of the transducers 10 and, thus, a 360° response will be provided by the transducers 10.

Figure 2:
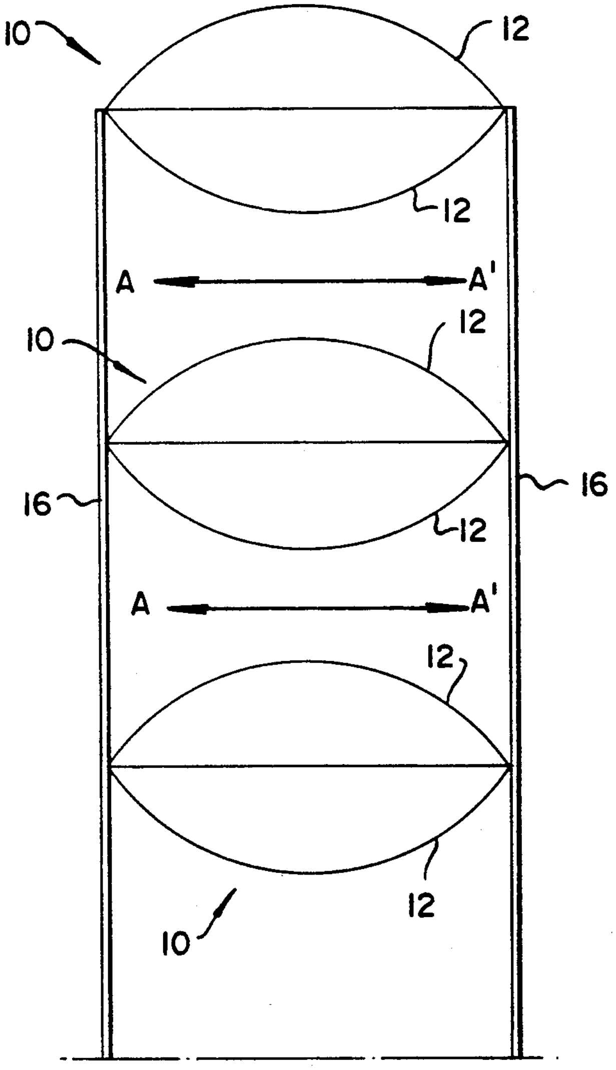
FIG. 2 depicts an array of hemispherical transducers for providing a 360° response.

Referring now to FIG. 2, there is shown a hemispherical array of transducers 10, each having a layer of piezoelectric film 12 on the surface thereof. The hemispherical array design produces a 360° dispersion of sound in the horizontal direction as depicted in reference to FIG. 1 and also provides a complete sound dispersion in the vertical plane as well thereby forming an omni-directional horn. The design in FIG. 2 includes a rigid support member 16 which preferably is of sufficient strength to support the array of transducers 10, while at the same time has a minimal surface area to thereby minimize interference with the radiation of sound from the transducers 10. This array is particularly suitable for sound production in the high-frequency range.

Figure 3:
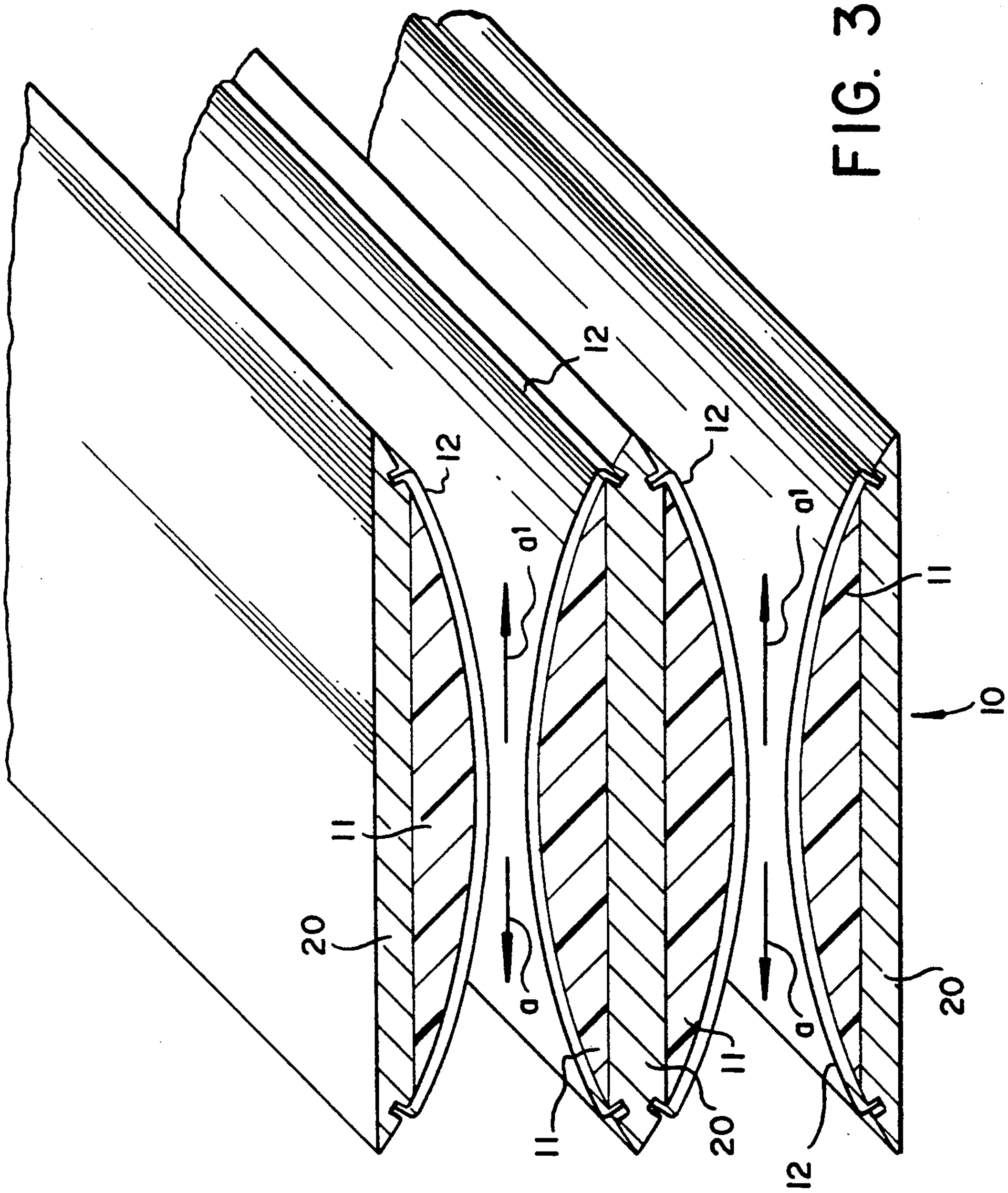
FIG. 3 is a cross-sectional view of an array of transducers for providing a high efficiency low frequency response.

Referring to FIG. 3 there is shown an alternative embodiment of the present invention which provides a high efficiency response in the low frequency area. In this embodiment transducers 10 are hemicylindrrical to thereby greatly increase the effective mouth area and improve low frequency response. Within this embodiment, piezoelectric film 12 may be of varying curvature. The film 12 may be flatter to reduce flare rate and effective mouth size or the film 12 may be more curved to increase flare rate and effective mouth size.

The present invention has been found to be particularly advantageous since it simulates the effect of an infinite number of horns centered about a single axial location and facing in all directions to produce a complete 360° response. Referring back to FIG. 1, it can be seen that the area between transducers forms two generally horn-shaped areas having outputs in the directions a and $a^1$, respectively. A horn consists of a throat, a flare and a mouth. Generally the mouth of a horn must be one-quarter of the wavelength at the cutoff frequency. Thus, the horn length must be extended to provide a mouth of that size without substantially effecting the flare rate of the throat of the horn. The present invention provides a simulated horn-type effect by having a small throat designated by B in FIG. 1, an acceptable rate of flare through the throat region to a wide mouth, designated by M. This arrangement provides excellent sound reproduction along with a 360° response and incorporates the high efficiency of piezoelectric films in acoustic applications as well.

The firm support member 20 may be wood or another suitable material. The resilient backing means 11 is composed of any suitable material such as polyurethane foam to impart the proper tension and/or resiliency to piezoelectric films 12. In addition, backing means 11 is preferably vented to the outside atmosphere in some manner such as by choosing a porous foam material as backing means 11 to allow air intake and exhaust in response to motion of piezoelectric film 12. The preferred material for piezoelectric films 12 is polyvinylidene flouride (PVDF), which is a known material for electro-acoustic transducers. The material can be a single-ply film or it may be laminated to produce bimorph or multimorph elements which will multiply the transducer response. The material has high pyroelectric sensitivity and incorporates the other useful properties of PVDF, many of which are described in "Electroacoustic Transducers with Piezoelectric High Polymer Films", Tamura et al, Journ. Aud. Eng. Soc., Vol.23, No.1, Jan. 1, 1975, pp. 21-26; "Comments on ,Electroacoustic Transducers With Piezoelectric High Polymer Films,", Edelman et al, Journ. Aud. Eng. Soc., Vol.24, No.7, Sep. 2, 1976, pp. 577–578, and "High Polymer Piezoelectric Film in Electroacoustical Transducer Applications", 79th Convention of Audio Engineering Society, Oct. 12–16, 1985, the Klapholz, J., disclosures of which are hereby incorporated by reference.

In another embodiment of the present invention (not shown), the transducer may be extended in length to become hemicylindrical to thereby increase the effective mouth area in the horizontal direction. In this manner, the low frequency response can be amplified and the efficiency can be increased for the low frequency response due to the increase in the effective mouth area of the horn. Again, an array of hemicylindrical horns can be employed in the same manner as the hemispherical horns in FIG. 2 to produce the low-frequency end of the sound spectrum.

The foregoing description of the invention has been provided for purposes of illustration and description only, and many modifications and variations will be apparent to one of ordinary skill in the art from the above teachings. Accordingly, the scope of the invention is to be defined by the claims appended hereto.

What is claimed is:

1. A piezoelectric-type electro-acoustic transducer which comprises:

at least two piezoelectric films each having electrodes on both surfaces thereof, said films being so disposed that the outer surfaces of said films face each other and being stretched into opposing concave surfaces by means of a resilient backing material located adjacent the inner surfaces of said films, and each of said films being connected to an electric circuit such that elongation of each of said films as a result of the action of individual electric fields causes said films to oscillate and thereby displace air located between said films.

2. A transducer as claimed in claim 1 wherein films are hemispherical.

3. A transducer as claimed in claim 1 wherein said films are hemicylindrical.

4. A transducer as claimed in claim 1 comprising at least four piezoelectric films.

5. A transducer as claimed in claim 4 wherein at least two of said films are hemispherical.

6. A transducer as claimed in claim 5 wherein at least two of said films are hemicylindrical.

7. A transducer as claimed in claim 6 wherein said piezoelectric films comprise at least two layers of film laminated together.

8. A transducer as claimed in claim 1 wherein said resilient backing materials are vented to the atmosphere to provide air intake and exhaust in response to motion of said films.

9. A transducer as claimed in claim 1 wherein said films produce the desired result of dynamic range expansion.

* * * * *